United States Patent [19]

Kardos

[11] Patent Number: 5,261,648
[45] Date of Patent: Nov. 16, 1993

[54] COMPUTER ISOLATING DEVICE

[75] Inventor: Michael J. Kardos, Palo Alto, Calif.

[73] Assignee: Sun Microsystems, Inc., Mountain View, Calif.

[21] Appl. No.: 839,372

[22] Filed: Feb. 21, 1992

[51] Int. Cl.$^5$ .............................................. F16F 7/00
[52] U.S. Cl. ................... 267/136; 248/638; 403/203; 267/153
[58] Field of Search ............. 267/75, 81, 90, 130, 267/136, 140.3, 140.5, 141, 141.1, 141.3, 141.4, 141.7, 153; 248/632, 634, 638, 917; 403/202, 203

[56] References Cited

U.S. PATENT DOCUMENTS

| 2,215,743 | 9/1940 | Saurer | 403/203 X |
| 3,072,393 | 1/1963 | Hawkins | 267/153 |
| 3,448,949 | 6/1969 | Kelley | 267/153 X |
| 4,533,126 | 8/1985 | Mueller et al. | 267/141 |

FOREIGN PATENT DOCUMENTS 1114062 9/1961 Fed. Rep. of Germany ...... 267/153

OTHER PUBLICATIONS

"Protecting Electronic Equipment From Shock and Vibration," Daniel T. Lilley, reprinted from Machine Design, Jan. 24, 1985.

Primary Examiner—Robert J. Oberleitner
Assistant Examiner—Josie A. Ballato
Attorney, Agent, or Firm—Blakely Sokoloff Taylor & Zafman

[57] ABSTRACT

The present invention discloses an isolating device comprising an isolator designed to reciprocatively support the housing of a computer by means of an insert member inserted into the body of the isolator and having the bottom end of the insert member compressibly and extensibly supported therein. The insert member comprises a base mounted to the bottom of the computer housing and two stems extending downward from the base for insertion into two insert cavities within the body of the isolator. Square-like flanges are provided on the bottom corners of the stems such that they define a reception cavity between the flanges at the end of the stems and an upward rim on the opposing sides of each stem. The isolator comprises two insert cavities within the body of the isolator having a plug extending upward from the bottom wall of each cavity for insertion into the support cavities of the stems when the insert member is inserted into the isolator. Downward ridges are provided on the inner walls of the insert cavities for corresponding attachment to the upward rims of the flanges so as to flexibly lock the flanges within the isolator. To further support the computer housing from the isolator, a support jacket having sides and a dividing wall defining two reception cavities for reception of the isolator is provided for attachment between the computer housing and the isolator.

16 Claims, 2 Drawing Sheets

COMPUTER ISOLATING DEVICE

BACKGROUND OF THE INVENTION (1) Field of the Invention

The present invention relates to devices for and methods of preventing shock and vibration from disrupting or destroying sensitive electronic and mechanical equipment. More particularly, this isolating device is directed to protecting the sensitive electro-mechanical components of a computer by means of isolating the housing of the computer from shocks and vibrations found within the surrounding environment.

(2) Prior Art

Within the past several years, computer manufacturers have developed computers which run at faster operating speeds and with increased memory capabilities. Because of these advances in computer technology, the electro-mechanical components within the computer, such as the disk drive assemblies and the integrated circuit board connections, have become more complex and thus more delicate and sensitive to mechanical shocks and vibrations generated within the surrounding environment. Therefore, the need has arisen to provide a device which can isolate the electro-mechanical components within the computer from the potentially harmful effects of shocks and vibrations.

The necessity of such a device is even more apparent when it is considered that personal computers are now commonly used within factories where heavy machinery and the like produce shocks and vibrations on a constant basis. The same is also true for portable computers which must be capable of withstanding the various forces exerted upon them in the multitude of environments in which they are used.

No isolating devices are currently known to be in use in the computer industry which comprise a structure specifically designed to prevent shocks and vibrations from entering the housing of the computer so as to protect the electro-mechanical components therein. The most analogous piece of equipment commonly used with computers is what is known as "skid pads," which are the rubber or plastic feet placed on the bottom of a computer housing or its stand. These skid pads may be thought of as providing some form of shock protection since they normally comprise approximately an eighth to a quarter of an inch of rubber or soft plastic and are affixed to the bottom of the housing. The principal function of the skid pads, however, is to prevent the computer from sliding around and scratching the surface on which it is placed. Skid pads do function incidentally to isolate the computer from shocks and vibrations due to the inherent damping characteristics of the material used. However, they are not designed for compressible and extensible support of the computer housing wherein the optimal system natural frequency (i.e., the summation of the natural frequencies of the computer and its mount or isolating device) is achieved so as to minimize the net effect of shocks and vibrations.

Another analogous piece of equipment used in some computers is a rubber bushing, which is used in the mounting of disk drive assemblies and circuit boards to "holding brackets" within the computer. These bushings have been designed with rubber interposed between the joints and connections of sensitive equipment. However, protecting the sensitive equipment within the computer piece by piece is an inadequate solution to the problem since shocks and vibrations from outside the computer will often resonate the system natural frequency. When this occurs, all components of the computer collectively oscillate at a large or maximum amplitude and the sensitive equipment therein may be damaged from this reaction. Therefore, a device is needed which can attenuate shocks and vibrations before they can reach the rigid housing of the computer and cause damage to the electro-mechanical components therein.

SUMMARY OF THE INVENTION

It is an object of the present invention to provide an isolating device to be used specifically with a computer to dissipate the energy of shocks and vibrations entering the housing of the computer so as to protect the electro-mechanical components therein.

Another object of the invention is to provide an isolating device comprising a structure specifically designed to preclude resonance of the system natural frequency by the incoming shocks and vibrations by obtaining a relatively low system natural frequency (i.e., $SNF < < 45$ hertz).

It is a further object of the invention to provide an isolating device having a composition and structure that is highly compressible and extensible to permit large deflections of the isolating device so as to minimize the net effect of shocks and vibrations on the rigid housing of the computer.

In order to achieve these and other objects, the present invention discloses an isolating device having an isolator designed to reciprocatively support the computer housing by means of an insert member being inserted into the body of the isolator and having a stem compressibly and extensibly suspended therein. The insert member comprises a base mounted to the bottom of the computer housing and two stems extending downward from the base for insertion into two insert cavities within the body of the isolator. Square-like flanges are provided on the bottom of each stem such that they define a plug cavity between the flanges and an upward rim on the opposing sides of each stem.

The isolator comprises two insert cavities within the body of the isolator with each having a plug extending upward from the bottom of the isolator for insertion into the plug cavity of each stem when the insert member is inserted within the isolator. A space is provided between the end of the stem and the plug so as to permit reciprocative movement of the stem within the insert cavity while precluding exceedingly large displacements from occurring. In order to secure the isolator to the insert member, downward ridges are provided on the inner walls of the insert cavities for corresponding attachment to the upward rims on the sides of the stems so as to flexibly lock the insert member within the isolator.

A support jacket is also provided having sides defining two reception cavities for reception of the isolator. The support jacket has a first lip extending upward into a receptacle in the bottom of the computer housing and a second lip extending circumferentially inward into the reception cavities for attachment to the isolator.

BRIEF DESCRIPTION OF THE DRAWINGS

The objects, features and advantages of the present invention will become apparent from the following detailed description of the preferred embodiment in which.

DETAILED DESCRIPTION OF THE INVENTION

In the following description, numerous details such as specific materials, structures, configurations and dimensions are set forth in order to provide a more complete understanding of the present invention. However, it is understood by those skilled in the art that the present invention can be practiced without these specific details. In other instances, well-known elements, devices and the like are not set forth in detail in order to avoid unnecessarily obscuring the present invention.

In order to attenuate the effects of shocks and vibrations on a large system such as a computer, it is necessary to use an isolating device which produces a relatively low system natural frequency (i.e., SNF<<45 hertz, where the optimal system natural frequency is approximately SNF=20 hertz). By doing this, the SNF falls below the range of excitation frequencies of the incoming shocks and vibrations and prevents them from resonating the system natural frequency of the computer system. To obtain a low system natural frequency, the structure of the isolating device is designed to permit large deflections of the device while it is mounted to the computer housing 1. In this respect, the present invention discloses an isolating device designed to provide compressible and extensible support of the housing 1 of a computer by means of a insert member 2 having one end affixed to the housing 1 and the other end movably supported within the isolator 3.

In addition, the preferred embodiment of the present invention comprises an isolator 3 made from a compliant and resilient material having a high damping factor for maximum attenuation of shocks and vibrations as they pass through the isolator 3 itself. Specifically, the isolator 3 herein described is made from a material known as Isodamp ® C-1002 which is manufactured by E-A-R Division, Cabot Corporation of Indianapolis, Ind. However, as one skilled in the art would know, the present invention may also be used with other isolating materials that have a relatively high damping factor such as natural rubber, neoprene, butyl rubber and the like.

Figure 1:
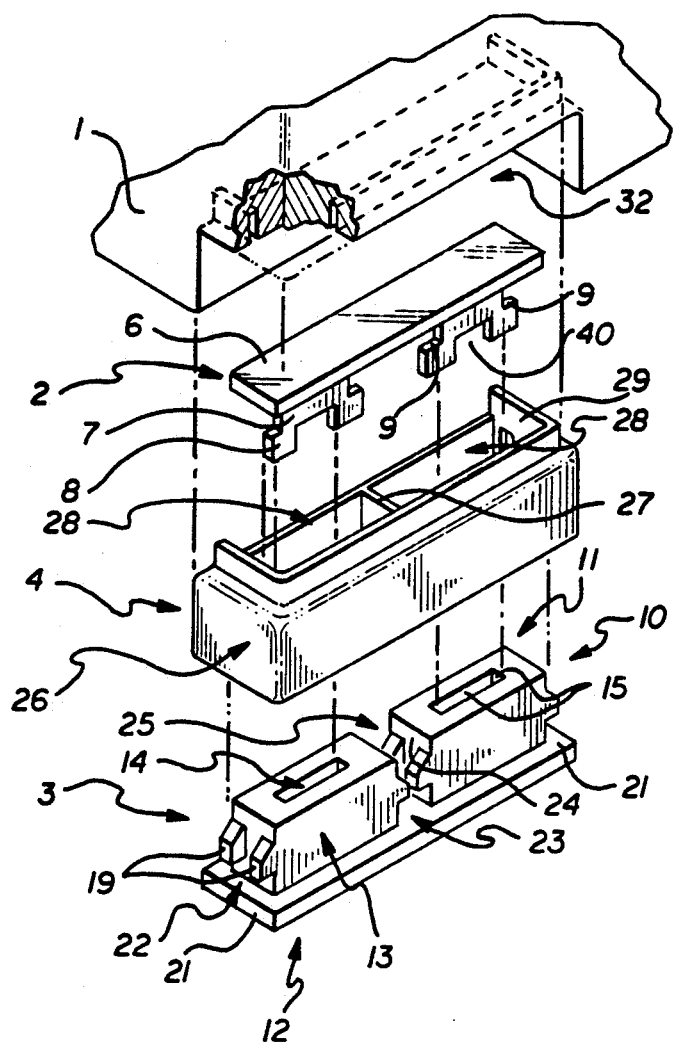
FIG. 1 is an exploded perspective view of the isolating device as it would be mounted to the computer housing.

As shown in FIG. 1, the insert member 2 comprises a rectangular base 6 rigidly mounted to the bottom of the housing 1 and a bottom end adapted for insertion into the body 10 of the isolator 3. The base 6 of the insert member 2 is mounted to the housing 1 either by having the insert member 2 formed out of the material of the housing 1 as an integral part thereof or by affixing the base 6 to the housing 1 by means of an adhesive, bolts or the like. However, as one skilled in the art would realize, the insert member 2 itself can be attached to the computer housing 1 in a manner which permits flexible suspension of the insert member 2 from its attachment point on the housing 1, such as an independent suspension system, so as to increase the deflection range of the isolator 3. The bottom end of the insert member 2 comprises two rectangular stems 7 extending downward from the base 6, with each stem 7 having square-like flanges 8 positioned on the sides thereof so as to define a plug cavity 40 between the flanges 8 and an upward rim 9 on opposing sides of the stems 7.

Figure 2:
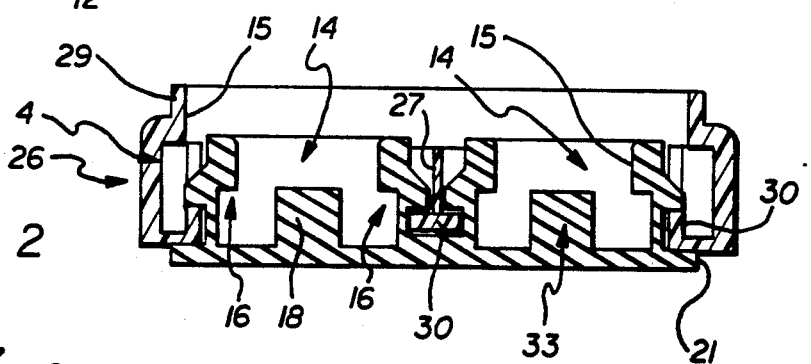
FIG. 2 is a side view of the isolating device showing the support jacket with the isolator inserted therein.

The isolator 3, also shown in FIG. 1, comprises a generally rectangular body 10 defined by a top 11, a bottom 12 and sides 13. Within the body 10 of the isolator 3, two insert cavities 14, as shown in FIG. 2, are defined by inner walls 15 for insertion and attachment of the flanges 8 of the stems 7 thereto. The insert cavities 14 are adapted to receive and flexibly lock onto the stems 7 by means of a downward ridge 16 on opposing inner walls 15 which correspond to the upward rims 9 on the opposing sides of the stems 7.

The isolator 3 permits the insert member to reciprocate up and down within the body 10 of the isolator 3 by compression and extension of the sides 13 of the isolator body 10 between the base 6 of the insert member 2 and the surface on which the computer is placed. The stems 7 of the insert member 2 are allowed to freely move within the insert cavities 14 of the isolator 3 by means of being suspended therein with the bottom of the flanges 8 elevated above the bottom 12 of the isolator 3 approximately three (3) millimeters.

Figure 3:
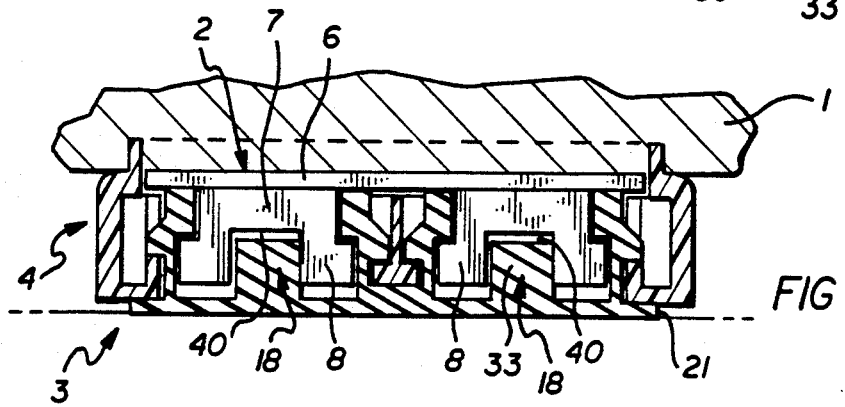
FIG. 3 is a side view of the isolating device fully assembled and mounted on the computer housing showing the insertion of the insert member into the isolator.

Due to this configuration, the compliant and resilient material of the isolator 3 permits significant compression and extension of the isolating device when the system encounters an oscillating force such as a shock pulse. Therefore, with the flanges 8 flexibly locked into the insert cavities 14 of the isolator 3, as shown in FIG. 3, the base 6 of the insert member 2 compresses against the sides 13 of the isolator body 10 during acceleration of the pulse and extend upward without detachment of the stems 7 from the isolator body 10 by compression of the upward rims 9 on the sides of the stems 7 against the downward ridges 16 on the inner walls 15 of the isolator 3 during deceleration.

So as to prevent the stems 7 of the insert member 2 from bottoming out during an exceedingly large displacement of the stems 7 caused by a severe shock pulse, plugs 18 extending upward from the bottom 12 of the isolator are provided in the center of the insert cavities 14. The plugs 18, shown in FIGS. 2 and 3, are adapted to fit into the plug cavities 40 at the bottom of the stems 7 so that there is space of approximately two (2) millimeters between the top of the plug cavities 40 and the top of the plugs 18. Therefore, in the preferred embodiment of the present invention, the stems 7 of the insert member 2 may be displaced two (2) millimeters before making compressible contact with the top of the plugs 18. The compliant and resilient material of the plugs 18 still permits downward displacement of the stems 7 so as to avoid substantial transmission of the shock pulse. However, the high damping factor of the material slows down the displacement and attenuates the energy of the shock pulse to reduce the net effect of the pulse on the computer system.

In the preferred embodiment, we have chosen the dimensions (length, width and height) of the isolator body 10 (45.5×9.5×8 mm), the plug 18 (6×2×7 mm), the stem 7 (2×6×14 mm), the flanges 8 (6×2×7 mm) and the plug cavity 40 (6×2×6 mm) to be of specific proportions in relation to the use of the Isodamp® C-1002 material and a computer having a weight of approximately twenty (20) pounds. With the given structure and dimensions, we have obtained a system natural frequency of approximately 27 hertz and have determined the best spatial relationship between the top of the plug cavity 40 and the top of the plug 18 to be two (2) millimeters, and that between the flanges 8 and the bottom 12 of the isolator 3 to be three (3) millimeters. However, as readily known by one skilled in the art, these dimensions are dependent upon the type of isolating material used, the weight of the computer, and the specific structure of the elements used. Therefore, the specific dimensions given are to be used only as a guideline for the preferred embodiment since the structure, material and dimensions of the invention may be varied to obtain a computer isolating device in accordance with the claims.

Additional support is added to the isolating device by the use of a support jacket 4, shown best in FIG. 1, which comprises sides 26 and a centrally located dividing wall 27 which define two reception cavities 28 within the support jacket 4 for reception of the isolator 3. In the preferred embodiment, the support jacket 4 has a first lip 29 around three of its sides 26 which extends upward from the sides 26 of the support jacket 4 into a receptacle 32 in the bottom of the housing 1. As shown in FIG. 2, a second lip 30 near the bottom of the support jacket 4 extends inward circumferentially from the sides 26 and dividing walls 27 of each reception cavity 28 to provide a means of attachment to the isolator 3.

For this purpose, the isolator 3, shown in FIG. 1, comprises two cleft walls 24 defining a cleft 25 between the two insert cavities 14 within the body 10 of the isolator 3 which is adapted to receive the dividing wall 27 of the support jacket 4. The isolator 3 further comprises a circumferential edge 21 that extends outward beyond the sides 13 of the body 10 and two wedges 19 on each of the cleft walls 24 and the sides 13 of the isolator body 10 opposite the cleft walls 24, with each of the wedges 19 having a trapezoidal shape and a planar face pointing downward. The wedges 19 are positioned just above the circumferential edge 21 so as to define a first groove 22 between the planar faces of the wedges 19 and the top face of the circumferential edge 21, and a second groove 23 at the bottom 12 of the cleft 25 for the reception of the second lip 30 of the support jacket 4.

For assembly and attachment of the isolating device to the housing of the computer, as shown in FIG. 1, the insert member 2 is first mounted to the housing 1 by affixing its base 6 to the bottom of the housing 1 within the rectangular receptacle 32 provided. The isolator 3 is inserted into the bottom of the support jacket 4 with the insert cavities 14 opening upward near the first lip 29 of the support jacket 4. The isolator 3 is firmly pressed into the support jacket 4 until the second lip 30 snaps into the first and second grooves 22, 23 by temporarily deforming the wedges 19 as the second lip 30 passes over them. The isolator 3 is then attached to the insert member 2 by aligning the stems of the insert member 2 with the insert cavities 14 of the isolator 3 and pressing the isolator 3 upward until the flanges 8 are locked within the insert cavities 14. Assembly of the isolating device is thus complete.

Figure 4:
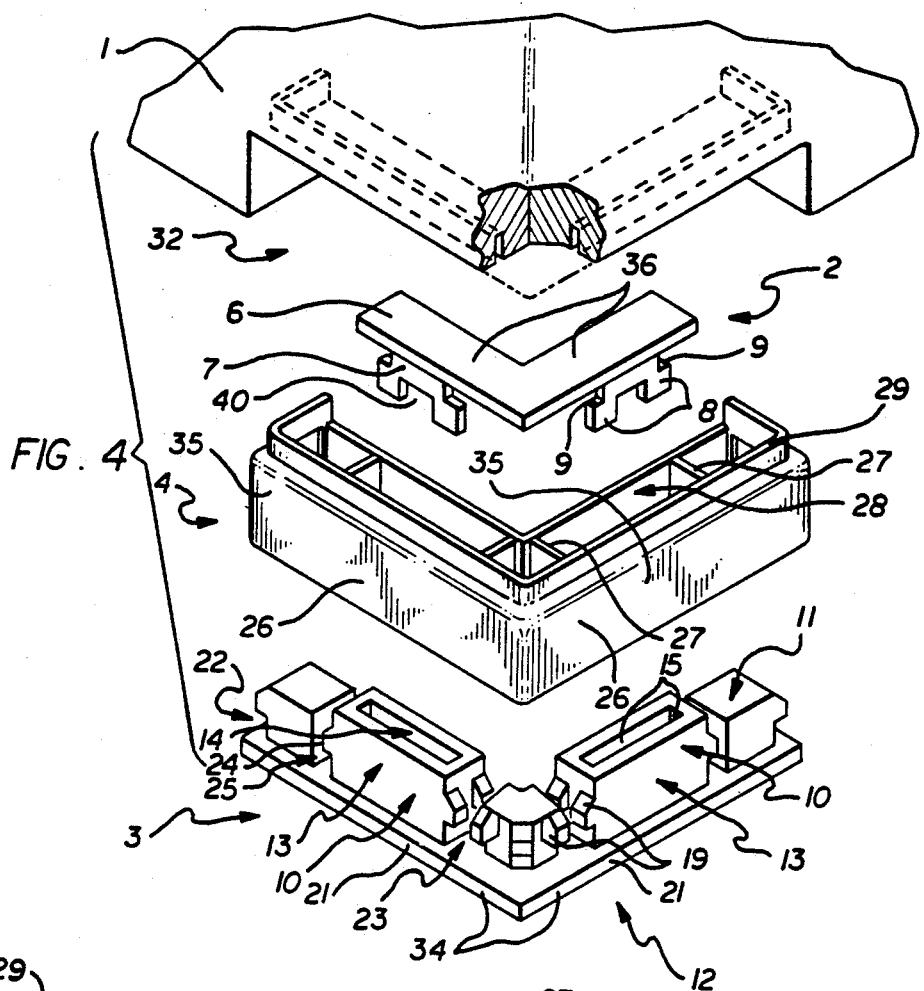
FIG. 4 is an exploded perspective view of an alternate embodiment of the isolating device as it would be mounted to the computer housing.
Figure 5:
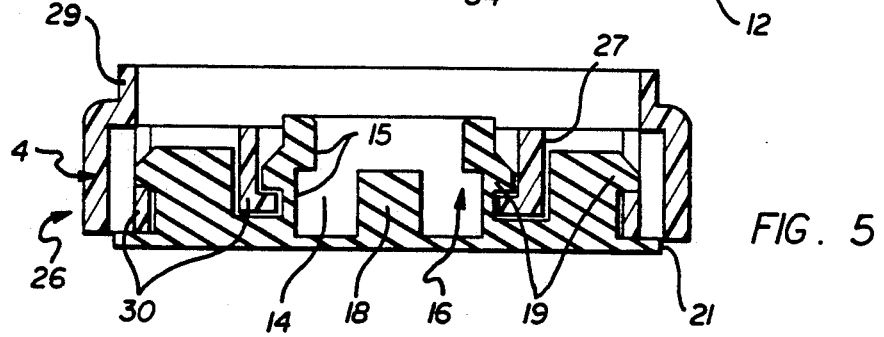
FIG. 5 is a side view of an alternate embodiment of the isolating device showing the support jacket with the isolator inserted therein.
Figure 6:
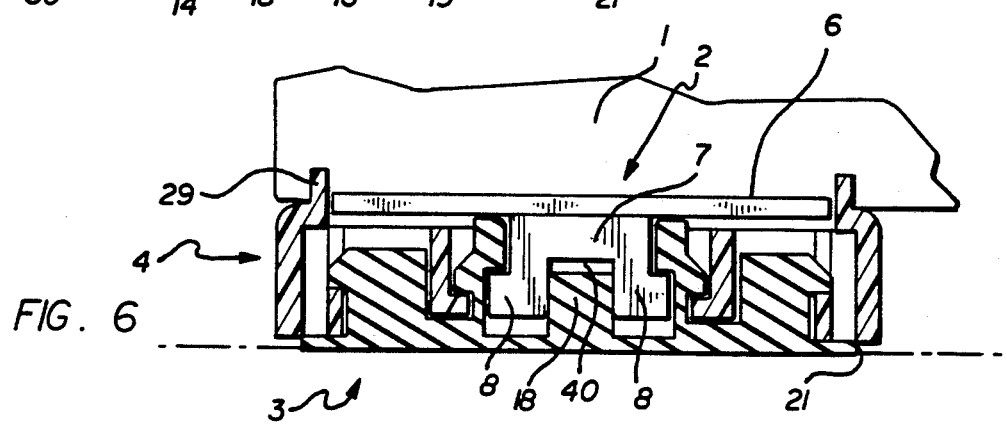
FIG. 6 is a side view of an alternate embodiment of the isolating device fully assembled and mounted on the computer housing showing the insertion of the insert member into the isolator.

In an alternate embodiment of the present invention, shown in FIGS. 4, 5 and 6, the support jacket 4 is made having two legs 35 orthogonally connected together at their ends to form an "L"-shaped support jacket 4 which is to be place within corresponding receptacles 32 on the corners of the computer housing 1. Each jacket leg 35 comprises sides 26 and two dividing walls 27, as shown in FIG. 4, which define five reception cavities 28 for reception of the isolator 3. A first lip 29 extending upward for placement within the receptacle 32 of the housing 1 traverses the outer sides 26 and outer corner of the support jacket 4. A second lip 30, as shown in FIG. 5, within each of the reception cavities 28 extends inward from the sides 26 and dividing walls 27 thereof for attachment to the isolator 3.

In this embodiment of the invention, an isolator 3, as shown in FIG. 4, is provided also having two legs 35 orthogonally connected together at their ends to form an "L"-shaped isolator 3 for corresponding attachment to the "L"-shaped support jacket 4. As shown in FIGS. 4 and 5, the isolator 3 comprises an insert cavity 14 in each isolator leg 35 thereof having a plug 18 and downward ridges 16 on the inner walls 15 of each insert cavity 14, as described above. The isolator 3 further comprises cleft walls 24 defining a cleft 25 on each side 13 of the insert cavities 14 for reception of the dividing walls 27 in each jacket leg 34 of the support jacket 4. Two wedges 19 having a trapezoidal shape are placed on each of the inside cleft walls 24 and the sides 13 of the isolator body 10 opposite the clefts 25. A circumferential edge 21 extending beyond the sides 13 of the isolator 3 is then placed on the bottom 12 of the isolator 3 so as to define a first groove 22 between the wedges 19 and the circumferential edge 21 and a second groove 23 within the cleft 25 itself.

For attachment of this embodiment of the isolating device to the housing 1, an insert member 2, shown in FIGS. 4 and 6, is provided having a base 6 which similarly comprises two legs 36 orthogonally connected together at their ends. Each base leg 36 comprises only one stem 7 extending downward therefrom, with each stem 7 having flanges 8 on the sides as described above. The base 6 of the insert member 2 is affixed to a corresponding "L"-shaped receptacle 32 positioned on the corners of the computer housing 1. During installation, the isolator 3 is inserted into the bottom of the support jacket 4 until the second lip 30 snaps into the first and second grooves 22,23 provided on the isolator 3. The isolator 3 and the support jacket 4 are then pressed upward into the receptacle 32 with the flanges 8 of the insert member 2 being inserted into the insert cavities 14 of the isolator 3 until the downward ridges 16 of the inner walls 15 of the isolator 3 are interlocked with the upward rims 9 of the flanges 8 of the insert member 2.

While the invention has been described in conjunction with the preferred embodiment, it is evident that numerous alternatives, depictions, variations and uses will be apparent to those skilled in the art in light of the foregoing description. Specifically, many different structures may be used so as to obtain the corresponding relationships in the suspended movement and flexible locking means of the insert member 2 within the isolator 3, and the attachment of the support jacket 4 to the isolator 3.

I claim:

1. A computer isolating device for dampening the effects of disturbances including shocks and vibrations on sensitive electro-mechanical equipment disposed within a computer housing, said computer isolating device comprising:

at least one isolator comprising a compliant material having a high damping factor for absorption of energy caused by said disturbances, with said isolator comprising a top, a bottom and sides defining a body of said isolator, with said body having inner walls defining at least one insert cavity within said body of said isolator;

at least one insert member comprising a base attached to said housing and at least one stem having a bottom inserted into said insert cavity of said isolator, said bottom of said stem disposed above said bottom of said isolator to form a gap therebetween, said stem being movably suspended from said base within said isolator so as to enable said stem to freely reciprocate within said insert cavity; and means for flexibly locking said insert member within said isolator to provide detachable attachment of said insert member within said isolator.

2. The computer isolating device of claim 1, wherein said base of said insert member is rigidly mounted to said housing.

3. The computer isolating device of claim 1, wherein said isolator comprises a plug extending upward from said bottom within said insert cavity to permit compressible contact between said insert member and said plug only upon substantial displacement of said insert member to inhibit substantially large oscillations of said insert member.

4. The computer isolating device of claim 3, wherein said stem of said insert member comprises a flange on each side of said stem extending downward therefrom to form a plug cavity between said flanges adapted for reception of said plug.

5. The computer isolating device of claim 1, wherein said flexible locking means comprises a downward ridge on said inner walls of said isolator body and a corresponding upward rim on each side of said stem to provide secure attachment of said insert member within said isolator body.

6. The computer isolating device of claim 1, wherein said computer isolating device further comprises a support jacket having sides defining at least one reception cavity for reception of said isolator, with said support jacket having a first lip extending upward within a receptacle of said housing.

7. The computer isolating device of claim 6, wherein said isolator comprises a means for engaging said sides of said support jacket.

8. The computer isolating device of claim 7, wherein said engagement means comprises a circumferential edge extending beyond said sides of said isolator and at least one wedge positioned adjacent thereto so as to form grooves between said wedges and said circumferential edge on said sides of said isolator.

9. The computer isolating device of claim 8, wherein said support jacket comprises a second lip extending inward circumferentially from said sides of said support jacket into said reception cavity for engagement of said second lip to said grooves of said isolator to secure said isolator within said support jacket.

10. A computer isolating device for dampening the effects of disturbances including shocks and vibrations on sensitive electro-mechanical equipment disposed within a computer housing, said computer isolating device comprising:

at least one isolator comprising a compliant material having a high damping factor for absorption of energy caused by said disturbances, with said isolator comprising a top, a bottom and sides defining a body of said isolator, with said body comprising inner walls defining at least one insert cavity within said body of said isolator;

at least one insert member comprising a base attached to said housing and at least one stem having a bottom suspended within said insert cavity of said isolator to provide reciprocative support of said housing on said isolator, with said stem comprising flanges disposed on the sides thereof extending downward therefrom to form a plug cavity between said flanges;

means for inhibiting substantially large oscillations of said insert member, with said inhibiting means comprising a plug extending upward from said bottom of said isolator within said insert cavity for insertion into said plug cavity of said insert member to permit compressible contact between said insert member and said plug during a substantial displacement of said insert member, said plug being separated from said bottom of said stem of said insert member during a state of rest; and means for flexibly locking said insert member within said isolator, with said locking means comprising a downward ridge on said inner walls of said isolator and a corresponding upward rim on each side of said stem to provide secure attachment of said insert member within said isolator.

11. The computer isolating device of claim 10, wherein said computer isolating device further comprises a support jacket having sides defining at least one reception cavity for reception of said isolator, with said support jacket having a first lip extending upward within a receptacle of said housing.

12. The computer isolating device of claim 11, wherein said isolator comprises a means for engaging said sides of said support jacket.

13. The computer isolating device of claim 12, wherein said engagement means comprises a circumferential edge extending beyond said sides of said isolator and at least one wedge positioned adjacent thereto so as to form grooves between said wedges and said circumferential edge on said sides of said isolator.

14. The computer isolating device of claim 13, wherein said support jacket comprises a second lip extending inward circumferentially from said sides of said support jacket said reception-cavity for engagement of said second lip to said grooves of said isolator to secure said isolator within said support jacket.

15. A computer isolating device for dampening the effects of disturbances including shocks and vibrations on sensitive electro-mechanical equipment disposed within a computer housing, said computer isolating device comprising:

at least one isolator comprising a compliant material having a high damping factor for absorption of energy caused by said disturbances, with said isolator comprising a top, a bottom and two legs orthogonally connected at their ends to define an "L"-shaped body of said isolator, with said body comprising inner walls defining at least one insert cavity in each of said isolator legs;

at least one insert member comprising a base with two legs orthogonally connected at their ends to define an "L"-shaped base for attachment to a corner of said housing, with said base legs each comprising at least one stem extending downward therefrom for insertion of said stem into said insert cavity of said isolator, with said stem comprising flanges disposed on the sides thereof extending downward therefrom to form a plug cavity between said flanges;

a support jacket comprising two legs orthogonally connected at their ends to define an "L"-shaped support jacket, with said jacket comprising sides defining at least one reception cavity in each of said jacket legs for reception of said isolator within said jacket, with said support jacket having a first lip extending upward within a receptacle of said housing;

means for inhibiting substantially large oscillations of said insert member, with said inhibiting means comprising a plug extending upward from said bottom of said isolator within each of said insert cavities for insertion into said plug cavities of said insert member to permit compressible contact between said insert member and said plug during a substantial displacement of said insert member;

means for flexibly locking said insert member within said isolator, with said locking means comprising a downward ridge on said inner walls of said isolator and a corresponding upward rim on each side of said stem to provide secure attachment of said insert member within said isolator; and means for securing said isolator within said support jacket.

16. The computer isolating device of claim 15, wherein said securing means comprises a circumferential edge extending beyond said body of said isolator and at least one wedge positioned on each of said isolator legs so as to form grooves between said wedges and said circumferential edge, with said securing means further comprising a second lip extending inward circumferentially from said sides of said support jacket into said reception cavity of said jacket legs for attachment of said second lip to said grooves of said isolator to provide secure attachment of said isolator within said support jacket.

* * * * *